US008392140B1

(12) United States Patent
Bartholet

(10) Patent No.: US 8,392,140 B1
(45) Date of Patent: Mar. 5, 2013

(54) SYSTEM AND METHOD FOR CALIBRATING A LOCATION DETERMINED BY AN INERTIAL NAVIGATION UNIT

(75) Inventor: William G. Bartholet, Issaquah, WA (US)

(73) Assignee: The Boeing Company, Chicago, IL (US)

(*) Notice: Subject to any disclaimer, the term of this patent is extended or adjusted under 35 U.S.C. 154(b) by 99 days.

(21) Appl. No.: 12/848,536

(22) Filed: Aug. 2, 2010

(51) Int. Cl.
*G01R 33/02* (2006.01)
*G01C 19/24* (2006.01)
*G01V 3/12* (2006.01)

(52) U.S. Cl. ............ 702/94; 702/95; 702/150; 324/244; 324/326

(58) Field of Classification Search .................... 702/94, 702/95, 150; 324/244, 326
See application file for complete search history.

(56) References Cited

U.S. PATENT DOCUMENTS 7,570,060 B2 * 8/2009 Zeller et al. ................... 324/326

OTHER PUBLICATIONS

Australian Government; IPS Radio and Space Services; *Geomagnetic Pulsations in Aeromagnetic Surveys*; [online]; [Retrieved on Nov. 12, 2010]; Retrieved from the Internet <URL: http://www.ips.gov.au/Educational/3/1/2; 3 pages.

Wikipedia, the free encyclopedia; *Schumann resonances*; [online]; [Retrieved on Nov. 12, 2010]; Retrieved from the Internet <URL: http://en.wikipedia.org/wiki/Schumann_resonances; 10 pages.

Scintrex a Division of LRS; *Magnetic Methods; CS-3 Cesium Magnetometer; High Resolution Magnetics*; [online]; [Retrieved on Nov. 12, 2010]; Retrieved from the Internet <URL: http://scintrexltd.com/documents/Scintrex_CS-3BrochurePN762711_0.pdf; 2 pages.

Los Alamos National Laboratory; News and Communications Office; *Test of Through-The-Earth Communication System Exceeds Expectations*; [online]; [Retrieved on Nov. 15, 2010]; Retrieved from the Internet <URL: http://www.lanl.gov/news/index.php/fuseaction/home.story/story_id/111441; 1 page.

* cited by examiner

*Primary Examiner* — Andrew Schechter
*Assistant Examiner* — L. Anderson
(74) *Attorney, Agent, or Firm* — Alston & Bird LLP

(57) ABSTRACT

A method, system and inertial navigation unit are provided in order to facilitate location determination by calibrating a location determined by an inertial navigation unit. The method may receive a magnetic pulse, such as a magnetic pulse generated by a lightening strike, with a plurality of first magnetometers and with a second magnetometer co-located with the inertial navigation unit. The method may also compare a representation of the magnetic pulse received by the plurality of first magnetometers to a respective representation of the magnetic pulse received by the second magnetometer. Further, the method may correct the location determined by the inertial navigation unit as a result of the comparing of the representation of the magnetic pulse received by the plurality of first magnetometers to the respective representation of the magnetic pulse received by the second magnetometer.

19 Claims, 3 Drawing Sheets

SYSTEM AND METHOD FOR CALIBRATING A LOCATION DETERMINED BY AN INERTIAL NAVIGATION UNIT

TECHNOLOGICAL FIELD

Embodiments of the present disclosure relate generally to the determination of a location by an inertial navigation unit and, more particularly, to the calibration of the location determined by the inertial navigation unit.

BACKGROUND

Inertial navigation units may be employed for location determination. For example, an inertial navigation unit may be carried by an individual such that the individual can determine his/her position by reference to the inertial navigation unit. As another example, an inertial navigation unit may be mounted upon or otherwise carried by a vehicle or other structure that is configured to move or be repositioned such that the position of the vehicle or other structure may be determined by reference to the inertial navigation unit.

While inertial navigation units may be widely used on the surface, some inertial navigation units may be deployed in underground applications, such as in underground tunnels, caverns or other subterrarian facilities. These inertial navigation units that are deployed underground may, for example, be carried by individuals who are underground or mounted upon or otherwise carried by vehicles or other structures that are deployed underground. The location information provided by inertial navigation units that are deployed in underground applications may be particularly helpful, as there may be fewer landmarks or other sources of location information underground than there are for surface-based applications.

An inertial navigation unit generally utilizes a plurality of accelerometers and gyroscopes to determine via dead reckoning the position, orientation and velocity without the need for an external reference. While the location that is initially determined by an inertial navigation unit may be relatively precise, the error associated with the location that is determined by the inertial navigation unit may grow or accumulate over time. Thus, the location that is determined by an inertial navigation unit that has been operational for some period of time may be less reliable than is desired for some applications.

BRIEF SUMMARY

A method, system and inertial navigation unit are therefore provided according to embodiments of the present disclosure in order to facilitate improved location determination. In this regard, the method, system and inertial navigation unit of one embodiment provide for correction of the error associated with the location determined by the inertial navigation unit such that the error does not continue to grow or accumulate over time. Thus, the location that is determined by an inertial navigation unit including, for example, an inertial navigation unit that has been operational for some period of time, may have less error and, therefore, be more reliable.

In one embodiment, a method is provided for calibrating a location determined by an inertial navigation unit. The method of this embodiment may receive a magnetic pulse, such as a magnetic pulse generated by a lightening strike, with a plurality of first magnetometers and with a second magnetometer co-located with the inertial navigation unit. The method may also compare a representation of the magnetic pulse received by the plurality of first magnetometers to a respective representation of the magnetic pulse received by the second magnetometer. Further, the method may correct the location determined by the inertial navigation unit as a result of the comparing of the representation of the magnetic pulse received by the plurality of first magnetometers to the respective representation of the magnetic pulse received by the second magnetometer.

A method of one embodiment may receive a plurality of magnetic pulses with the plurality of first magnetometers located at respective locations above ground and with the second magnetometer co-located with the inertial navigation unit underground. In this embodiment, the method may also transmit the representations of the magnetic pulses received by the first magnetometers to the inertial navigation unit located underground via low frequency signals, such as signals having a frequency of no more than 10 kHz. Also in this embodiment, the method may correct the location based upon a combination of individual corrections determined by comparing the respective representations of each respective magnetic pulse. The method of one embodiment may also define the representation of a magnetic pulse based on a time and a location at which the magnetic pulse was received.

In another embodiment, a system is provided that includes a plurality of first magnetometers configured to receive a magnetic pulse, such as a magnetic pulse generated by a lightening strike, an inertial navigation unit configured to determine a location and including a second magnetometer configured to receive the magnetic pulse, and a processor configured to compare a representation of the magnetic pulse received by the second magnetometer with a respective representation of the magnetic pulse received by the plurality of first magnetometers. The processor of this embodiment is also configured to correct the location determined by the inertial navigation unit as a result of comparing the representation of the magnetic pulse received by the plurality of first magnetometers to the respective representation of the magnetic pulse received by the second magnetometer.

The inertial navigation unit of one embodiment also includes the processor and a receiver for receiving the representation of the magnetic pulses received by the plurality of first magnetometers. The system of this embodiment may also include a transmitter configured to transmit the representation of the magnetic pulse received by the first magnetometers to the receiver of the inertial navigation unit via low frequency signals, such as signals having a frequency of no more than 10 kHz. In one embodiment, the plurality of first magnetometers are located at respective locations above ground and the inertial navigation unit and the second magnetometer are located underground. The processor of one embodiment may be further configured to define the representation of a magnetic pulse based on a time and a location at which the magnetic pulse was received. The processor of one embodiment may be configured to correct the location by correcting the location based upon a combination of individual corrections determined by comparing the respective representations of a plurality of magnetic pulses.

According to a further embodiment, an inertial navigation unit is provided that includes a receiver configured to receive a representation of a magnetic pulse received by a plurality of first magnetometers. The inertial navigation unit may also include a second magnetometer configured to receive the magnetic pulse, such as a magnetic pulse generated by a lightening strike, and a processor configured to determine a location of the inertial navigation unit. The processor may also be configured to compare the representation of the magnetic pulses received by the second magnetometer with the respective representation of the magnetic pulse received by the plurality of first magnetometers. The processor may further be configured to correct the location that has been determined as a result of comparing the representations of the magnetic pulse received by the plurality of first magnetometers to the respective representation of the magnetic pulse received by the second magnetometer.

The receiver of one embodiment is configured to receive low frequency signals, such as signals having a frequency of no more than 10 kHz, that provide the representation of the magnetic pulse received by the plurality of first magnetometers. The plurality of first magnetometers may be located at respective locations above ground and the inertial navigation unit and the second magnetometer may be located underground. The processor of one embodiment may be further configured to define the representation of a magnetic pulse based on a time and a location at which the magnetic pulse was received. The processor of one embodiment may be configured to correct the location by correcting the location based upon a combination of individual corrections determined by comparing the respective representations of each of a plurality of magnetic pulses.

In accordance with embodiments of the system and method, an inertial navigation unit may be calibrated in a reliable and timely manner. However, the features, functions and advantages that have been discussed may be achieved independently in various embodiments of the present disclosure and may be combined in yet other embodiments, further details of which may be seen with reference to the following description and drawings.

BRIEF DESCRIPTION OF THE SEVERAL VIEWS OF THE DRAWING(S)

Having thus described embodiments of the disclosure in general terms, reference will now be made to the accompanying drawings, which are not necessarily drawn to scale, and wherein:

DETAILED DESCRIPTION

Embodiments of the present disclosure now will be described more fully hereinafter with reference to the accompanying drawings, in which some, but not all embodiments are shown. Indeed, these embodiments may be embodied in many different forms and should not be construed as limited to the embodiments set forth herein; rather, these embodiments are provided so that this disclosure will satisfy applicable legal requirements. Like numbers refer to like elements throughout.

Figure 1:
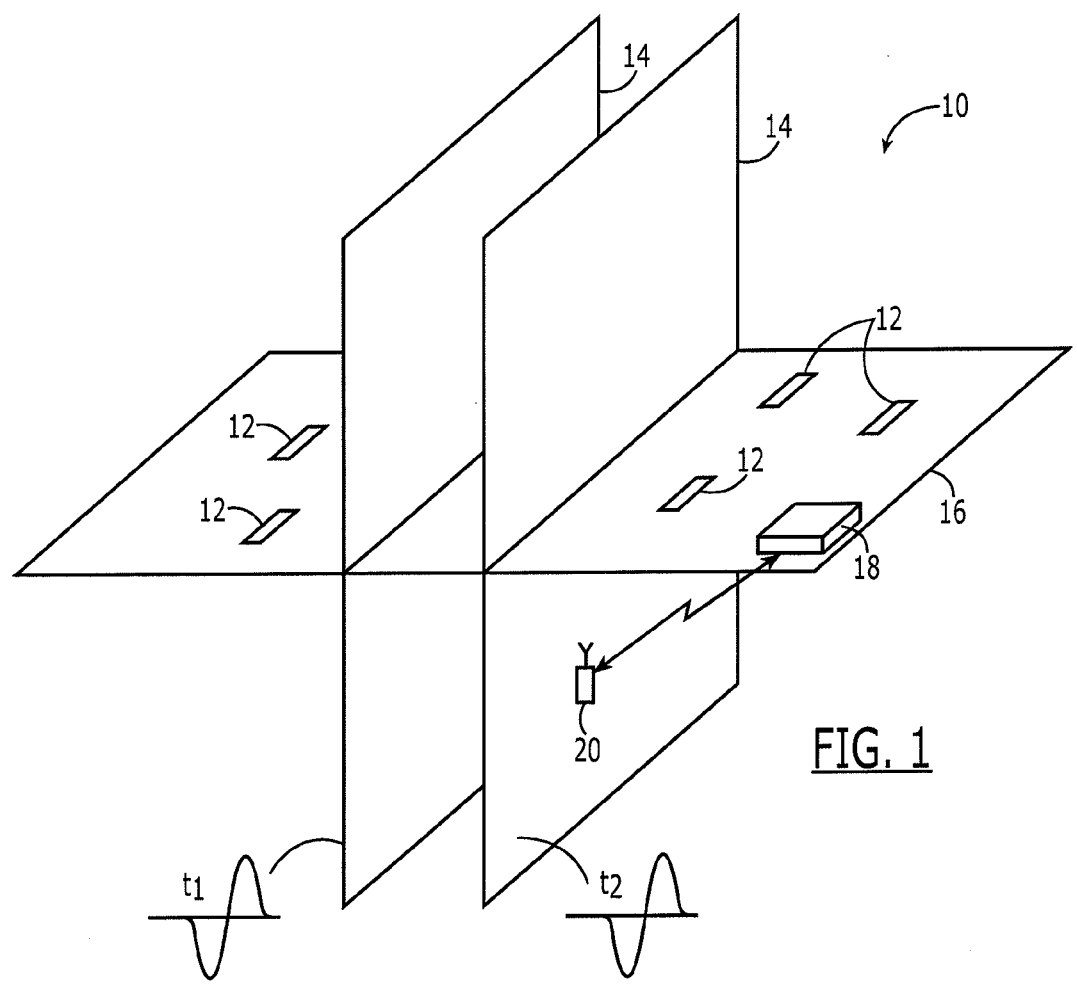
FIG. 1 is a schematic representation of a system in accordance with one embodiment of the present disclosure in which the location determined by an inertial navigation unit disposed in an underground setting is calibrated.

Referring now to FIG. 1, a propagating magnetic pulse 14 is depicted at time $t_1$ and a subsequent time $t_2$. Magnetic pulses 14 generally propagate outward from an origin or source at a particular velocity. As such, a propagating magnetic pulse 14 may be defined by a wavefront which, in turn, is defined in terms of the position of the magnetic pulse at respective instances in time as represented, for example, by the portions of the wavefront at time $t_1$ and time $t_2$ in FIG. 1. Among other things, the wavefront of a magnetic pulse 14 establishes the direction of movement of the magnetic pulse, such as in a direction perpendicular to the wavefront.

A magnetic pulse 14 may be generated in various manners. For example, a magnetic pulse 14 may be generated by a lightning strike which creates a magnetic pulse that propagates outwardly in all directions from the location at which the lightning struck. Indeed, there are numerous lightning strikes and attendant magnetic pulses 14 around the world. For example, about 50 lightning strikes occur per second in various locations around the world, on average, such that there are approximately 50 magnetic pulses 14 per second that propagate from the lightning strikes in all different directions. However, magnetic pulses 14 may be generated by sources other than lightning strikes including other natural sources as well as manmade sources.

In accordance with an embodiment of the present disclosure, a system 10 for calibrating an inertial navigation unit 20 may include a plurality of first magnetometers 12 positioned at various locations. In one example embodiment, the plurality of first magnetometers 12 are positioned on or above the surface 16 of the earth. A magnetometer 12 is configured to detect a magnetic pulse 14 that impinges thereupon and to identify the time at which the magnetic pulse was detected by the magnetometer. Based upon the detected magnetic pulse 14, the magnetometer 12 may provide a representation of the magnetic pulse, such as an indication that a magnetic pulse was detected as well as the time at which the magnetic pulse was detected. The plurality of first magnetometers 12 may include any of a variety of magnetic sensors. For example, the magnetometers may be a CS-3 Cesium magnetometer available from Scintrex, Ltd. of Ontario, Canada. In this regard, a CS-3 Cesium magnetometer has a sensitivity of 0.0006 nanoTesla*Root (Hz) rms. For a lightning strike having a frequency of about 100 hertz, the rms generated by CS-3 Cesium magnetometer would be about 0.006 nanoTesla. As such, a magnetometer 12, such as a CS-3 Cesium magnetometer, having a sensitivity of the type described above would be sufficiently sensitive to measure the magnetic pulses 14 generated by lightning strikes. It is to be noted, however, that a CS-3 Cesium magnetometer is just one example of a magnetometer 12 that may be utilized in conjunction with embodiments of the present disclosure. Additionally, while the plurality of first magnetometers 12 may all be the same type of magnetometer in one embodiment, the plurality of first magnetometers of another embodiment may be different types of magnetometers.

The magnetic pulses 14 generated by a lightning strike generally have frequencies in the tens of hertz, such as 100 hertz and beyond. Additionally, the magnetic field strength intensity of a magnetic pulse 14 generated by a lightning strike is generally about 0.1 gamma or 0.1 nanoTesla. As will be described below, the relatively low frequency of the magnetic pulses 14 generated by lightning strikes may be advantageous in one embodiment in that the magnetic pulses penetrate the earth deeply and can therefore be detected and measured not only on the surface 16 of the earth, but also underground.

Figure 2:
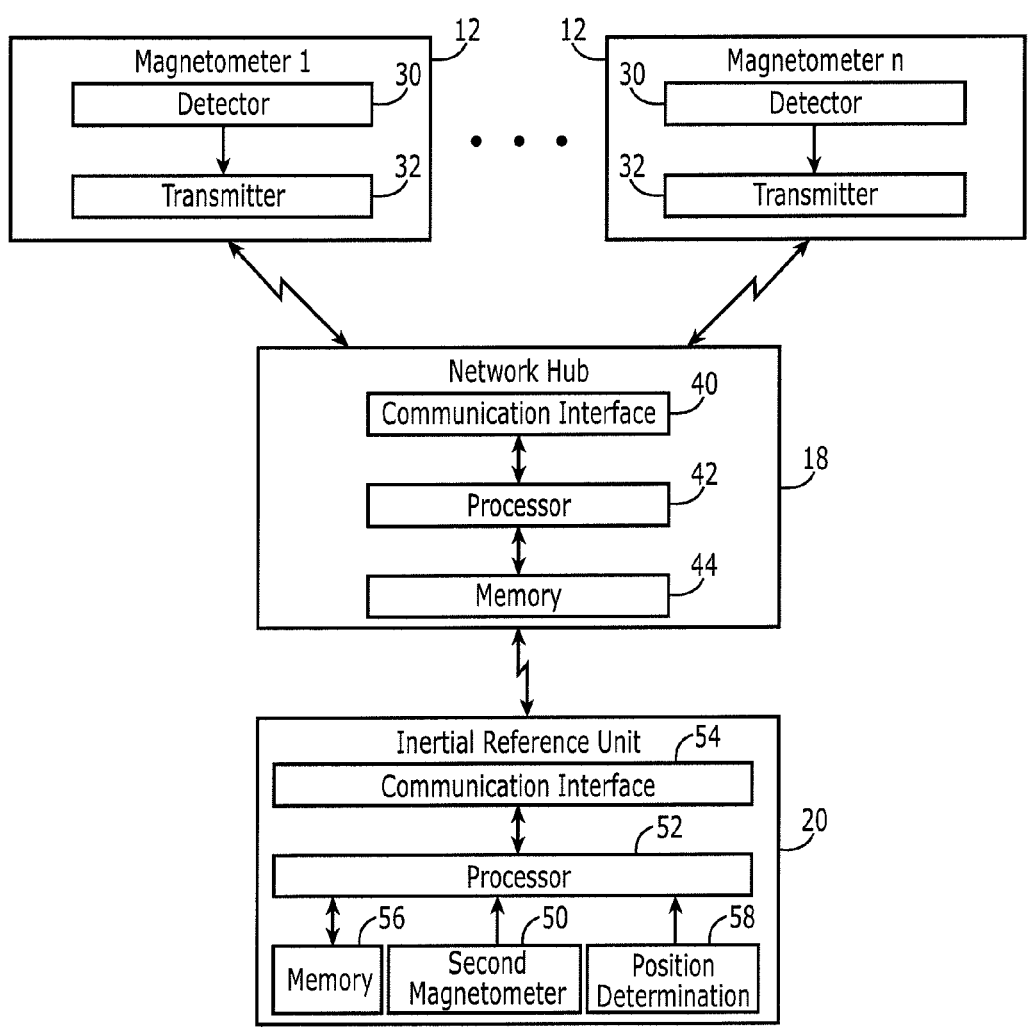
FIG. 2 is a block diagram of the system of the embodiment of FIG. 1.
Figure 3:
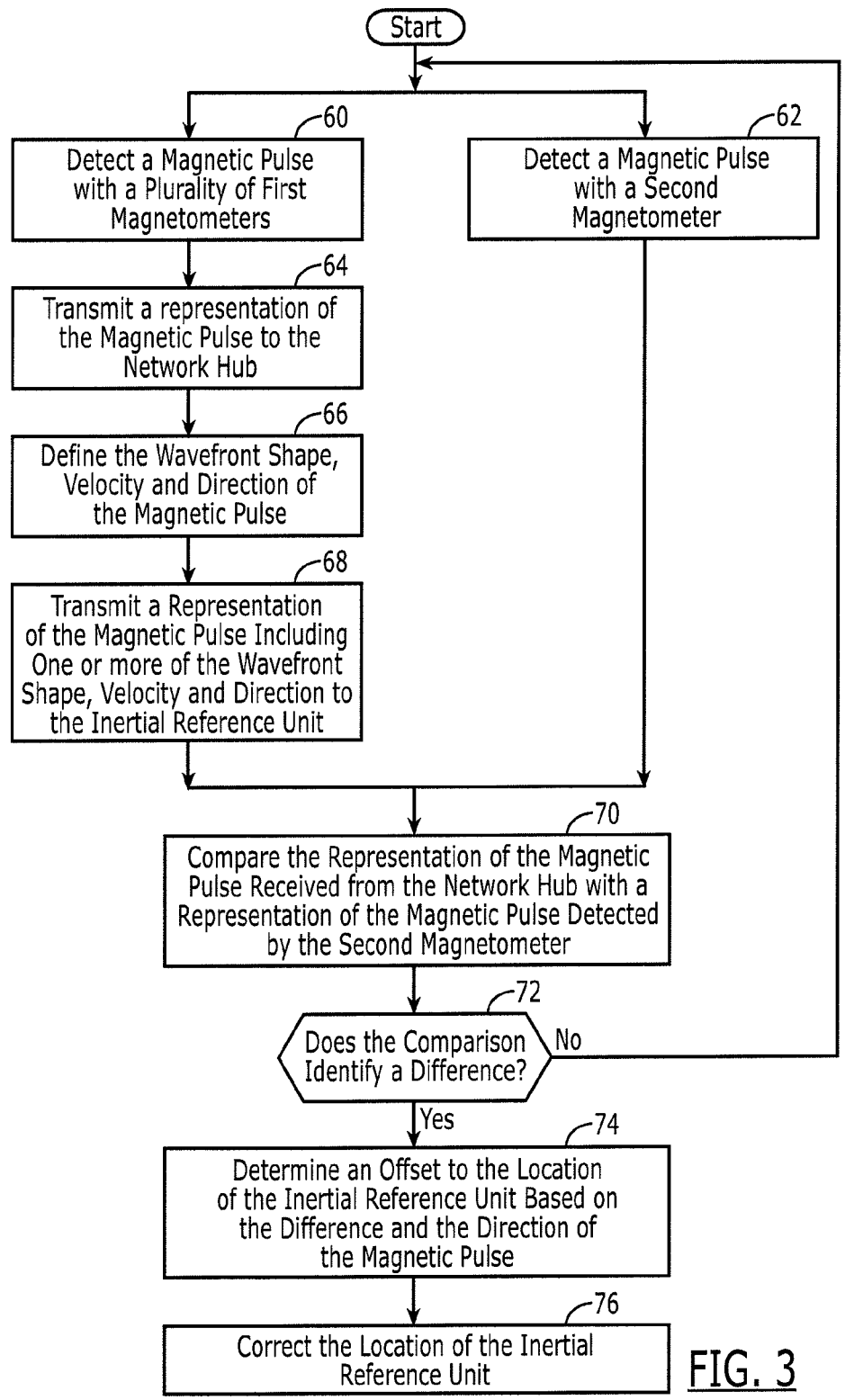
FIG. 3 is a flowchart of the operations performed in accordance with one embodiment of the present disclosure.

As shown in FIG. 2 and in block 60 of FIG. 3, a magnetometer 12 generally includes a detector 30 for receiving and detecting a magnetic pulse 14. The detector 30 may include or otherwise be associated with a clock such that the time at which the magnetic pulse 14 is detected may be identified. Further, the magnetometer 12 may include or otherwise be associated with a transmitter 32 for transmitting a representation of the detected magnetic pulse 14, such as a signal indicating that a magnetic pulse has been detected and the time at which the magnetic pulse was detected, as well as an indication of the respective magnetometer 12 that detected the magnetic pulse and is making the report. See block 64 of FIG. 3. Although the magnetometer 12 may simply detect a magnetic pulse 14 and then transmit a signal indicating that the magnetic pulse has been detected, the detector 30 of one embodiment may identify the detected magnetic pulse as a magnetic pulse of interest following the detection of a magnetic pulse and prior to transmission of a representation of the detected magnetic pulse, such as by identifying the magnetic pulse as a magnetic pulse having an intensity greater than a predefined minimum threshold and/or having a frequency within a predefined range of frequencies characteristic of the magnetic pulses generated by lightning strikes as noted above prior to transmission of a representation of the detected magnetic pulse. Although not shown in the embodiment of FIG. 2, a first magnetometer 12 may also include a processor, such as described below in conjunction with the network hub 18, configured to identify a detected magnetic pulse 14 as a magnetic pulse of interest and/or to identify the time at which the magnetic pulse is detected.

In the illustrated embodiment, the system 10 also includes a network hub 18 which, in turn, includes a communication interface 40 for receiving the signals from the plurality of first magnetometers 12 that are indicative of the detection of a magnetic pulse 14 and the time at which the respective magnetic pulse was detected, as well as an indication of the respective magnetometer that is making the report. The communication interface 40 may be any means such as a device or circuitry embodied in either hardware, or a combination of hardware and software that is configured to receive signals from the plurality of first magnetometers 12 and, as described below, to receive and/or transmit signals from/to an inertial navigation unit 20. In this regard, the communication interface 40 may include a receiver and, in some embodiments, a transmitter. For example, the communication interface 40 may include an antenna (or multiple antennas) and supporting hardware and/or software for enabling communications with the plurality of first magnetometers 12 and/or an inertial navigation unit 20. In some environments, the communication interface 40 may alternatively or also support wired communication, at least with respect to the plurality of first magnetometers.

The network hub 18 may also include a processor 42 configured to identify the signals received from each of the plurality of the first magnetometers 12 that are indicative of the detection of the same magnetic pulse 14, that is, the magnetic pulse generated by the same source, such as a single lightning strike. The processor 42 of the network hub 18 may also know or otherwise have access to location information, such as location information stored by a memory device 44 associated with the processor, that defines the location of each of the plurality of first magnetometers 12. Based upon the predefined locations of the plurality of first magnetometers 12 that provided a report regarding the same magnetic pulse 14 and the time at which the same magnetic pulse was detected by each of the plurality of first magnetometers, the processor 42 of the network hub 18 may be configured to determine the shape and velocity of the wavefront of the magnetic pulse, such as in terms of the position of the magnetic pulse relative to time. Based upon the wavefront shape, the direction of movement may also be defined by the processor 42, such as in a direction perpendicular to the wavefront. See block 66 of FIG. 3.

The processor 42 of the network hub 18 may be configured in various manners. For example, the processor 42 may be embodied as one or more of various processing means such as a coprocessor, a microprocessor, a controller, a digital signal processor (DSP) or various other processing devices including integrated circuits such as, for example, an ASIC (application specific integrated circuit), an FPGA (field programmable gate array), a microcontroller unit (MCU), processing circuitry or the like. In one embodiment, the processor 42 may be configured to execute instructions stored in the memory device 44 or otherwise accessible to the processor. Alternatively or additionally, the processor 42 may be configured to execute hard coded functionality. As such, whether configured by hardware or software, or by a combination thereof, the processor 42 may represent an entity (e.g., physically embodied in circuitry) configured to perform operations according to embodiments of the present disclosure. Thus, for example, when the processor 42 is embodied as an ASIC, FPGA or the like, the processor may be specifically configured hardware for conducting the operations described herein. Alternatively, as another example, when the processor 42 is embodied as an executor of software instructions, the instructions may specifically configure the processor to perform the algorithms and/or operations described herein when the instructions are executed. However, in some cases, the processor 42 may be a processor of a specific device (e.g., a network hub 18). While the network hub 18 may include a processor 42 as described above, some or all of the processing functionality may, instead, be provided by the plurality of first magnetometers 12 and/or the inertial navigation unit 20 in other embodiments with the network hub simply collecting and passing along the signals relating to the detected magnetic pulses 14.

In addition to the plurality of first magnetometers 12 and the network hub 18, the system 10 of the illustrated embodiment also includes an inertial navigation unit 20 that is spaced apart from the plurality of first magnetometers and that is also configured to detect the same or at least some of the same magnetic pulses as those detected by the plurality of first magnetometers. In contrast to the illustrated embodiment of the plurality of first magnetometers 12 that are shown to be located on or above the surface 16 of the earth, the inertial navigation unit 20 of the illustrated embodiment is located underground and may be, for example, carried by an individual, a vehicle or other machine or structure that is located underground, such as in a tunnel or other subterranean facility. In order to permit the magnetic pulses 14 to be detected by the plurality of first magnetometers 12, as well as the inertial navigation unit 20, it is therefore relevant that the magnetic pulses that are generated by lightning strikes propagate both along the surface 16 of the earth and within the earth. In other embodiments, however, the inertial navigation unit 20 may be located on or above the surface 16 of the earth, albeit at a different location than at least some of the plurality of first magnetometers 12.

In order to detect the magnetic pulse 14, the inertial navigation unit 20 may include a second magnetometer 50 that is configured to receive the magnetic pulse. See operation 62 of FIG. 3. The second magnetometer 50 of the inertial navigation unit 20 may be the same type of magnetometer as the plurality of first magnetometers 12. Alternatively, the second magnetometer 50 of the inertial navigation unit 20 may be a different type of magnetometer that is still configured to receive magnetic pulses 14 of the frequency and intensity described above, such as the magnetic pulses generated by lightning strikes. As shown in FIG. 2, the inertial navigation unit 20 may also include a processor 52 in communication with the second magnetometer 50 for receiving a signal provided by the second magnetometer indicative of the detection of a magnetic pulse 14. The processor 52 and/or the second magnetometer 50 of the inertial navigation unit 20 may include or otherwise be associated with a clock such that the time at which the magnetic pulse 14 was detected may be identified and associated with the detected magnetic pulse. The processor 52 of the inertial navigation unit 20 may be configured in various manners including in each of the various manners described above in conjunction with the processor 42 of the network hub 18.

In the illustrated embodiment, the network hub 18 and the inertial navigation unit 20 may be in communication with one another. As such, the communication interface 40 of the network hub 18 may be configured to provide a representation of the signals provided by the plurality of first magnetometers 12 that are indicative of the detection of a magnetic pulse 14 and the time at which the magnetic pulse was detected to the inertial navigation unit 20. See operation 68 of FIG. 3. In order to facilitate communication between the network hub 18 and the inertial navigation unit 20, the network hub may be configured to provide a relatively reduced representation of the magnetic pulse 14 that was detected by the plurality of first magnetometers 12 relative to the amount of data that would be required to be communicated if the signals provided by the plurality of first magnetometers indicative of the detection of the magnetic pulse and the time at which the magnetic pulse was detected were merely relayed to the inertial navigation unit. Indeed, the network hub 18 may provide a representation of the signals provided by the plurality of first magnetometers 12 in the form of a definition of the wavefront of the magnetic pulse 14 including one or more of the wavefront shape, the velocity at which the magnetic pulse propagated and the direction in which the magnetic pulse propagated. The inertial navigation unit 20 may therefore also include a communication interface 54 that is configured to receive the representation of the magnetic pulse 14 provided by the network hub 18. In embodiments in which the inertial navigation unit 20 is underground, the communication interfaces of the network hub 18 and the inertial navigation unit may be configured to communicate at relatively low frequencies, such as at 10 kHz or less, to facilitate the propagation of the signals through the earth. The communication interface 54 of the inertial navigation unit 20 of one embodiment includes a receiver and may be embodied in various manners including those described above in conjunction with the network hub 18.

In the illustrated embodiment, the inertial navigation unit 20 may be configured to identify the position of the inertial navigation unit. For example, the inertial navigation unit 20 may include a position determination unit 58 which, in turn, may include one or more accelerometers and gyroscopes for determining the position of the inertial navigation unit. As a result of the tendency of an inertial navigation unit 20 to determine its position with an error that accumulates or grows over time, the inertial navigation unit of one embodiment of the present disclosure may be configured to identify the error in the determined position, such that the error may be corrected. In this regard, the inertial navigation unit 20, such as the processor 52, may analyze the representation of the magnetic pulse 14 provided by the network hub 18, such as by analyzing the description of the wavefront, its velocity and its direction of propagation, relative to the position of the inertial navigation unit. In this regard, the processor 52 may determine the time at which the magnetic pulse 14 would have been expected to have been detected by the inertial navigation unit 18 at its current position (as defined by the position determination unit 58) based upon the definition of the wavefront of the magnetic pulse and its velocity as provided by the network hub 18. The processor 52 of the inertial navigation unit 20 may then compare the time at which the magnetic pulse 14 was expected to have been detected by the inertial navigation unit with the time at which the magnetic pulse was actually detected by the inertial navigation unit. See operation 70 of FIG. 3.

In instances in which the inertial navigation unit 20 is somewhat displaced from the position that has been determined by the position determination unit 58, such as due to an error in the determined position in the direction in which the magnetic pulse 14 is propagating, these times, that is, the time at which the magnetic pulse was actually detected and the time at which the magnetic pulse was expected to have been detected, will differ from one another. See operation 72 of FIG. 3. Based upon the difference in time and the velocity at which the magnetic pulse 14 is propagating as provided by the network hub 18, the inertial navigation unit 20, such as the processor 52, may determine the distance by which the position of the inertial navigation unit is in error with the distance simply being the product of the velocity of the magnetic pulse and the difference in time between the time at which the magnetic pulse was detected by the inertial navigation unit and the time at which the magnetic pulse was expected to have been detected by the inertial navigation unit. In addition, the direction in which the position of the inertial navigation unit 20 is determined to be in error is the direction in which the magnetic pulse 14 is propagating, such as provided by the network hub 18 or otherwise determinable from the definition of the wavefront of the magnetic pulse provided by the network hub. See operation 74 of FIG. 3. Thus, the inertial navigation unit 20, such as the processor 52, may correct its position by adjusting the position by the distance and in the direction that is determined in the manner described above based upon the difference between the time at which the inertial navigation unit is expected to detect the magnetic pulse 14 and the time at which the inertial navigation unit actually detects the magnetic pulse. See operation 76. The updated location may be stored in a memory 56 associated with the processor 52, such as shown in FIG. 2, provided to the position determination unit 58 for use as a baseline for subsequent position determinations and/or displayed or otherwise provided to a user interacting with the inertial navigation unit 20.

The process of FIG. 3 may be repeated on numerous occasions based upon the detection of different magnetic pulses 14 by the plurality of first magnetometers 12 and the second magnetometer 50 of the inertial navigation unit 20. For each or at least a plurality of the magnetic pulses 14 that are detected, a determination may be made, such as by the processor 52 of the inertial navigation unit 20, as to whether there is any difference in the time at which the magnetic pulse was detected by the second magnetometer 50 of the inertial navigation unit and the time at which the inertial navigation unit was expected to have detected the magnetic pulse based upon the signals provided by the plurality of first magnetometers 12. In instances in which the times differ, a corresponding correction to the position of the inertial navigation unit 20, both in terms of distance and direction, may be determined and the position of the inertial navigation unit may be correspondingly updated.

Since lightning strikes occur on a repeated basis, such as about 50 times per second on average, the location of the inertial navigation unit 20 may be repeatedly updated in a plurality of different directions such that the resulting position has a lower error associated therewith and is accordingly more reliable. Indeed, in one embodiment, the rapidity with which magnetic pulses 14 may be detected and then utilized to correct the position of an inertial navigation unit 20 may be such that the offset or correction provided by the detection of each magnetic pulse may be determined, but may not immediately be applied to the position of the inertial navigation unit. Instead, an average, such as a moving average, of a plurality of the most recent corrections or offsets may be maintained with the position of the inertial navigation unit 20 being updated at intervals, such as on a periodic basis or the correction or offset exceeds a predefined threshold, by taking into account this average correction or offset. For example, in one embodiment, the inertial navigation unit 20, such as the processor 52, may maintain a moving average of the common centroid of many correction vectors that are attributable (in distance and direction) to the detection of magnetic pulses 14 in the recent past. In instances in which the position is updated on a periodic basis, the period may be established so as to be sufficiently long that the position of the inertial navigation unit 20 is not constantly changing in the absence of movement of the inertial navigation unit, but short enough that the amount of error in the position determined by the inertial navigation unit does not grow or accumulate to an undesirable amount.

Although one embodiment of a system 10 for calibrating an inertial navigation unit 20 has been provided, other embodiments of a system for calibrating an inertial navigation unit are contemplated in accordance with other embodiments of the present disclosure. For example, the plurality of first magnetometers 12 of other embodiments may communicate directly with the inertial navigation unit 20 such that the network hub 18 is omitted. In these embodiments, the inertial navigation unit 20, such as the processor 52, may be configured to perform the processing described above in conjunction with the network hub 18 in terms of analyzing the signals provided by the plurality of first magnetometers 12 and determining a description of the wavefront and its velocity and direction based upon the signals from the plurality of first magnetometers. Alternatively, a network hub 18 may be employed, but need not be distinct from all of the plurality of first magnetometers 12 as shown in FIG. 1, but may, instead, be co-located with a respective first magnetometer.

In the above-described embodiment, the inertial navigation unit 20, such as the processor 52, is configured to compare the time at which the magnetic pulse 14 was received by the inertial navigation unit and the time at which the same magnetic pulse was expected to have been received by the inertial navigation unit based upon the signals provided by the plurality of first magnetometers 12. Alternatively, this comparison and the determination of the corresponding correction, if any, may be performed by another system entity, such as the processor 42 of the network hub 18. In this embodiment, the inertial navigation unit 20 may be configured to provide information regarding its detection of the magnetic pulse 14, such as a signal indicating the detection of the magnetic pulse and the time at which the magnetic pulse was detected, as well as the position of the inertial navigation unit to, for example, the network hub 18. The network hub 18, such as the processor 42 of the network hub, could then compare the time at which the magnetic pulse 14 was received by the inertial navigation unit 20 relative to the time at which the magnetic pulse was expected to have been received by the inertial navigation unit based upon the position of the inertial navigation unit and the definition of the wavefront and the velocity and direction of the wavefront attributable to the magnetic pulse. Based upon this comparison, the network hub 18, such as the processor 42, could determine the correction, if any, to the position of the inertial navigation unit 20 and could, in turn, provide this correction to the inertial navigation unit or, alternatively, provide an updated position to the inertial navigation unit.

Many modifications and other embodiments of the present disclosure set forth herein will come to mind to one skilled in the art to which these embodiments pertain having the benefit of the teachings presented in the foregoing descriptions and the associated drawings. Therefore, it is to be understood that the present disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for calibrating a location determined by an inertial navigation unit, the method comprising:
   receiving a magnetic pulse with a plurality of first magnetometers and with a second magnetometer co-located with the inertial navigation unit;
   comparing a representation of the magnetic pulse received by the plurality of first magnetometers to a respective representation of the magnetic pulse received by the second magnetometer; and
   correcting the location determined by the inertial navigation unit as a result of the comparing of the representation of the magnetic pulse received by the plurality of first magnetometers to the respective representation of the magnetic pulse received by the second magnetometer.

2. A method according to claim 1 wherein receiving the magnetic pulse comprises receiving a plurality of magnetic pulses with the plurality of first magnetometers located at respective locations above ground and with the second magnetometer co-located with the inertial navigation unit underground.

3. A method according to claim 2 further comprising transmitting the representations of the magnetic pulses received by the first magnetometers to the inertial navigation unit located underground via signals having a frequency of no more than 10 kHz.

4. A method according to claim 2 wherein correcting the location comprises correcting the location based upon a combination of individual corrections determined by comparing the respective representations of each respective magnetic pulse.

5. A method according to claim 1 wherein receiving the magnetic pulse comprises receiving a plurality of magnetic pulses generated by lighting lightning strikes.

6. A method according to claim 1 further comprising defining the representation of a magnetic pulse based on a time and a location at which the magnetic pulse was received.

7. A system comprising:
   a plurality of first magnetometers configured to receive a magnetic pulse;
   an inertial navigation unit configured to determine a location and comprising a second magnetometer co-located with the inertial navigation unit and configured to receive the magnetic pulse, wherein the inertial navigation unit including the second magnetometer is spaced apart from the plurality of first magnetometers; and
   a processor configured to compare a representation of the magnetic pulse received by the second magnetometer with a respective representation of the magnetic pulse received by the plurality of first magnetometers, the processor also configured to correct the location determined by the inertial navigation unit as a result of comparing the representation of the magnetic pulse received by the plurality of first magnetometers to the respective representation of the magnetic pulse received by the second magnetometer.

8. A system according to claim 7 wherein the inertial navigation unit further comprises the processor and a communication interface for receiving the representation of the magnetic pulses received by the plurality of first magnetometers.

9. A system according to claim 8 further comprising a transmitter configured to transmit the representation of the magnetic pulse received by the first magnetometers to the receiver of the inertial navigation unit via signals having a frequency of no more than 10 kHz.

10. A system according to claim 7 wherein the plurality of first magnetometers are located at respective locations above ground and the inertial navigation unit and the second magnetometer are located underground.

11. A system according to claim 7 wherein the first and second magnetometers are configured to receive a plurality of magnetic pulses generated by lightning strikes.

12. A system according to claim 7 wherein the processor is further configured to define the representation of a magnetic pulse based on a time and a location at which the magnetic pulse was received.

13. A system according to claim 7 wherein the processor is configured to correct the location by correcting the location based upon a combination of individual corrections determined by comparing the respective representations of a plurality of magnetic pulses.

14. An inertial navigation unit comprising:
a communication interface configured to receive a representation of a magnetic pulse received by a plurality of first magnetometers;
a second magnetometer co-located with the inertial navigation unit and configured to receive the magnetic pulse, wherein the inertial navigation unit including the second magnetometer is spaced apart from the plurality of first magnetometers; and
a processor configured to determine a location of the inertial navigation unit, the processor also configured to compare the representation of the magnetic pulses received by the second magnetometer with the respective representation of the magnetic pulse received by the plurality of first magnetometers, the processor further configured to correct the location that has been determined as a result of comparing the representations of the magnetic pulse received by the plurality of first magnetometers to the respective representation of the magnetic pulse received by the second magnetometer.

15. An inertial navigation unit according to claim 14 wherein the communication interface is configured to receive signals having a frequency of no more than 10 kHz that provide the representation of the magnetic pulse received by the plurality of first magnetometers.

16. An inertial navigation unit according to claim 14 wherein the plurality of first magnetometers are located at respective locations above ground and the inertial navigation unit and the second magnetometer is located underground.

17. An inertial navigation unit according to claim 14 wherein the second magnetometer is configured to receive a plurality of magnetic pulses generated by lightning strikes.

18. An inertial navigation unit according to claim 14 wherein the processor is further configured to define the representation of a magnetic pulse based on a time and a location at which the magnetic pulse was received.

19. An inertial navigation unit according to claim 14 wherein the processor is configured to correct the location by correcting the location based upon a combination of individual corrections determined by comparing the respective representations of each of a plurality of magnetic pulses.

* * * * *